(12) United States Patent
Credendino et al.

(10) Patent No.: US 8,176,446 B2
(45) Date of Patent: May 8, 2012

(54) METHOD FOR COMPENSATING FOR VARIATIONS IN STRUCTURES OF AN INTEGRATED CIRCUIT

(75) Inventors: Santo Credendino, Raleigh, NC (US); Michael D. Hulvey, Shelburne, VT (US); Jothimalar Kuppusamy, Chennai (IN); Robert Kenneth Leidy, Burlington, VT (US); Paul William Pastel, Essex, VT (US); Bruce Walter Porth, Jericho, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 791 days.

(21) Appl. No.: 12/208,521

(22) Filed: Sep. 11, 2008

(65) Prior Publication Data

US 2010/0064273 A1 Mar. 11, 2010

(51) Int. Cl.
*G06F 17/50* (2006.01)

(52) U.S. Cl. .............................. 716/53; 716/55; 716/139
(58) Field of Classification Search .................... 716/53, 716/55, 139
See application file for complete search history.

(56) References Cited

U.S. PATENT DOCUMENTS

| | | | |
|---|---|---|---|
| 6,120,952 A | 9/2000 | Pierrat et al. | |
| 6,584,609 B1 | 6/2003 | Pierrat et al. | |
| 6,988,259 B2 | 1/2006 | Pierrat et al. | |
| 7,024,655 B2 | 4/2006 | Cobb | |
| 7,352,454 B2 * | 4/2008 | Bamji et al. | 356/141.1 |
| 7,559,044 B2 * | 7/2009 | Ikeuchi | 716/106 |

* cited by examiner

*Primary Examiner* — Thuan Do
(74) *Attorney, Agent, or Firm* — Schmeiser, Olsen & Watts; Richard Kotulak

(57) ABSTRACT

A method of for compensating for variations in structures of an integrated circuit. The method includes (a) selecting a mask design shape and selecting a region of the mask design shape; (b) applying a model-based optical proximity correction to all of the mask design shape; and after (b), (c) applying a rules-based optical proximity correction to the selected region of the mask design shape.

20 Claims, 6 Drawing Sheets

US 8,176,446 B2

METHOD FOR COMPENSATING FOR VARIATIONS IN STRUCTURES OF AN INTEGRATED CIRCUIT

FIELD OF THE INVENTION

The present invention relates to the field of integrated circuit manufacture; more specifically, it relates to a method for compensating for variations in structures of an integrated circuit.

BACKGROUND OF THE INVENTION

Despite the use of model-based optical proximity correction (OPC) in advanced integrated circuit fabrication processes, uncorrected shape variations still occur that result in integrated circuit structures variations that adversely impact integrated circuit performance. Accordingly, there exists a need in the art to mitigate the deficiencies and limitations described hereinabove.

SUMMARY OF THE INVENTION

A first aspect of the present invention is a method, comprising: (a) selecting a mask design shape and selecting a region of the mask design shape; (b) applying a model-based optical proximity correction to all of the mask design shape; and after (b), (c) applying a rules-based optical proximity correction to the selected region of the mask design shape.

A second aspect of the present invention is a method, comprising: (a) selecting a mask design shape and selecting a regions of the mask design shape, the mask design shape comprising a spine and two or more fingers extending perpendicularly from the spine, the selected regions consisting of regions of each of the fingers that are proximate to the spine; (b) applying a model-based optical proximity correction to all of the mask design shape; and after (b), (c) applying a rules-based optical proximity correction to the selected region of the mask design shape.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

A mask design shape is defined as a data element in a shapes file used to fabricate photomasks. A mask shape is defined as a region of defined opacity to actinic radiation as opposed to regions of defined transparency on a photomask used to fabricate an integrated circuit. Each mask shape on a photomask corresponds to a mask design shape in the shapes file. A circuit shape is defined as a physical structure (other than photoresist) formed on an integrated circuit during fabrication of the integrated circuit. Circuit shapes correspond to mask shapes. Fabrication of an integrated circuit requires multiple process steps, many process steps require one or more photomasks (mask levels), and each photomask requires a shapes file. Mask shapes on a photomask are transferred to an integrated circuit using a photolithographic process which includes: exposing a photoresist layer on the integrated circuit to actinic radiation through a photomask, developing the photoresist layer to transfer the pattern of mask shapes to the photoresist layer, performing a fabrication process (e.g., an etch, deposition, ion implantation) and then removing the photoresist layer. Actinic radiation is defined as radiation of a particular wavelength (e.g., UV) that causes a chemical reaction in a photoresist layer during a photolithographic process.

Model-based OPC operates using a computer model of the photolithographic process. The model determines how simulated mask shapes would appear as a simulated pattern in a photoresist layer after performing the photolithography process. When the simulated photoresist pattern does not fall within specified locations, the simulated mask shapes are then adjusted until the simulated the simulated photoresist pattern does fall within specified locations. The mask design shapes are then adjusted to conform to the adjusted simulated mask shapes. The OPC corrected mask design shapes are then used to fabricate a photomask having OPC corrected mask shapes. Rule-based OPC tests for a particular condition occurring in mask design shapes of a particular mask level and then applies corrections to those design shapes based on rules. For example, a 'nested' line consists of mask shapes on the photomask which employ the minimum allowed line and space. An exemplary rule of a rule-based OPC for nested lines with 100 mm minimum line and 100 nm minimum space could be to remove 5 nm per edge from the line so that the line is 90 nm wide and the space is 110 nm wide.

Figure 1A:
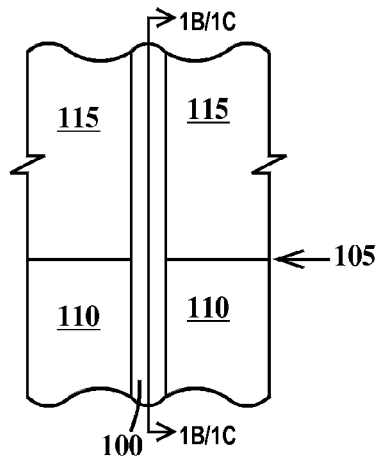
FIG. 1A is a top view and FIGS. 1B and 1C are side views through lines 1B-1B and 1C-1C respectfully of an ideal integrated circuit.
Figure 1B:
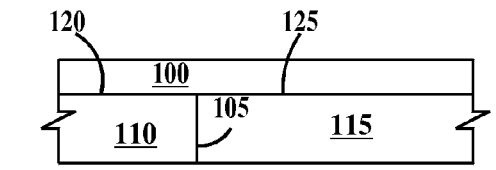
Figure 1C:
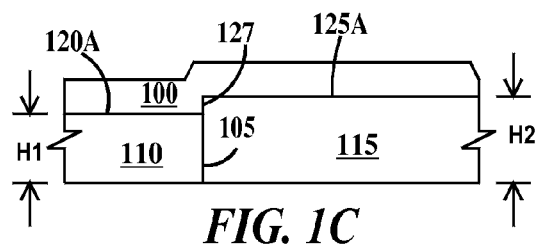

FIG. 1A is a top view and FIGS. 1B and 1C are side views through lines 1B-1B and 1C-1C respectfully of an ideal integrated circuit. In FIG. 1A, an ideal circuit shape 100 crosses an interface 105 between an underlying first region 110 and an abutting and underlying second region 115. As illustrated in FIG. 1A, circuit shape 100 crosses interface 105 perpendicularly (i.e. at a right angle to). Interface 105 may define a difference in reflectivity to actinic radiation between first region 110 and second region 115, a difference in height between first region 110 and second region 115, or both a difference in reflectivity to actinic radiation and height between first region 110 and second region 115. In FIG. 1B, top surface 120 of first region 110 is coplanar with top surface 125 of second region 115, but the reflectivity of the first and second regions are different. In FIG. 1C, first region 110 has a height H1 while second region 115 has a height H2 where H2 is greater than H1. Alternatively, height H2 could be less than height H1. A top surface 125A of second region 115 is raised above a top surface 120A of first region 110 forming a step 127. Top surface 120A of first region 110 and top surface 125A of second region 115 are parallel but not coplanar. In FIG. 1C, a top surface 120A of first region 110 may have a same reflectivity to actinic radiation or a different reflectivity to actinic radiation from second region 115. In one example, first and second regions 110 and 115 comprise different materials (e.g., silicon and insulator; metal and insulator).

Figure 1D:
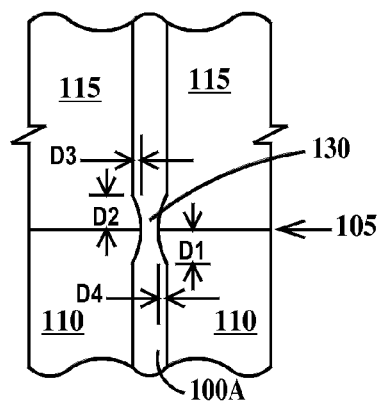
FIG. 1D is a top view of an actual integrated circuit similar to that of FIGS. 1A, 1B and 1C illustrating a defect to be corrected by the embodiments of the present invention.

FIG. 1D is a top view of an actual integrated circuit similar to that of FIGS. 1A, 1B and 1C illustrating a defect to be corrected by the embodiments of the present invention. FIG. 1D is similar to FIG. 1A except an actual circuit shape 110A has a necked region 130 proximate to interface 105. Necked region 130 extends over both first and second regions 110 and 115 distances D1 and D2 respectively. In one example D1 and D2 are about the same. In another example D1 and D2 are different. Necked region 130 occurs when a reflectivity difference to actinic radiation between first and second regions 110 and 115 exceeds a threshold value, when a height difference between first and second regions 110 and 115 exceeds a threshold value, or when both the reflectivity difference to actinic radiation and the height difference between first and second regions 110 and 115 exceed a combination of respective threshold values. Necked region 130 necks laterally distances D3 and D4. In one example D3 and D4 are about the same. In another example D3 and D4 are different. Due to process and other variability sources, the combined necking D3 and D4 could range from 0% (no necking at all) to 100% of the width of circuit shape 100A (an open) depending where circuit shape 100A is located on a integrated circuit chip and/or where the integrated chip is located on a wafer having an array multiple integrated circuit chips.

Figure 1E:
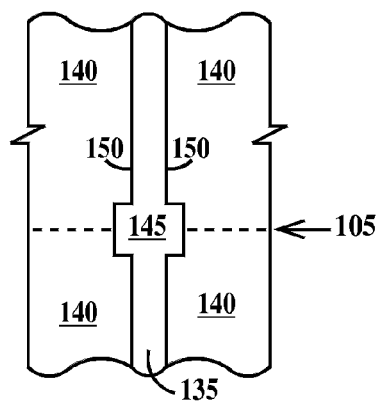
FIG. 1E is a top view of a compensated mask shape according to embodiments of the present invention that mitigate the defect illustrated in FIG. 1D.

FIG. 1E is a top view of a compensated mask shape according to embodiments of the present invention that mitigate the defect illustrated in FIG. 1D. In FIG. 1E, a mask shape 135 (corresponding to ideal circuit shape 100) is formed on a mask substrate 140. A collar 145 has been added to mask shape 135 proximate to where mask shape 135 would be aligned over interface 105 on a semiconductor substrate. Collar 145 extends from both sides 150 of mask shape 145 and overlaps interface 105.

Figure 1F:
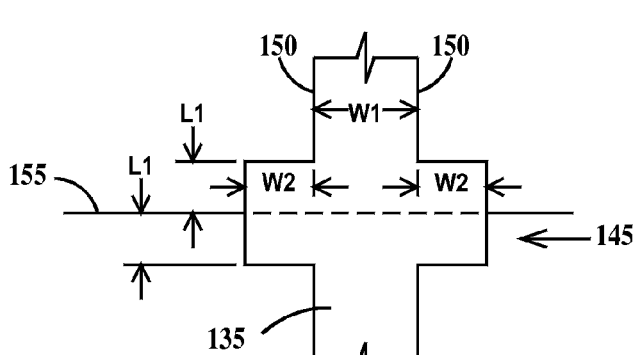
FIG. 1F is a detailed view of FIG. 1E.

FIG. 1F is a detailed view of FIG. 1E. In FIG. 1F, a reference line 155 corresponds to the ideal location of interface 105 (see FIG. 1E) relative to mask shape 135 when a photomask containing mask shape 135 is perfectly aligned to a substrate having interface 105. Mask shape 135 has a nominal width W1 and collar 145 has a width W1+2W2. In one example W2 is between about 4% and about 12% of W1. In one example W1 less than 100 nm. Collar 145 has a length 2L1 where L1 between about 4% and about 12% of W1.

Figure 1G:
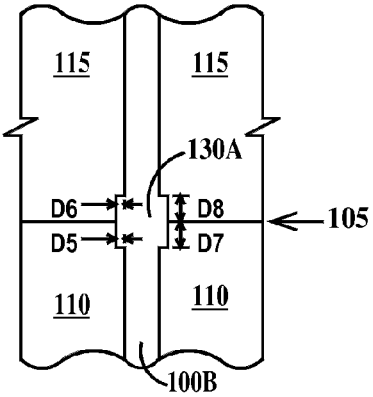
FIG. 1G is a top view of an actual integrated circuit illustrating elimination/reduction of the defect to be corrected by the embodiments of the present invention.

FIG. 1G is a top view of an actual integrated illustrating elimination/reduction of the defect to be corrected by the embodiments of the present invention. FIG. 1G is similar to FIG. 1A and FIG. 1D except an actual circuit shape 110B has a collar region 130A proximate to interface 105. Collar region 130A occurs when a collared mask shape as shown in FIG. 1E is used. Collar region 130A extends laterally along interface 105 a distance D5 over first region 110 and a distance D6 over second region 115 on both sides of circuit shape 100B. In one example D5 and D6 are about the same. In another example D5 and D6 are different. Collar region extends a distance D7 away from interface 105 over first region 110 and a distance D7 and extends a distance D8 away from interface 105 over second region 115 on both sides of circuit shape 110B. In one example D7 and D8 are about the same. In another example D7 and D8 are different. As discussed supra, the amount of necking shown in FIG. 1D is variable in that the total amount of necking could vary from 0% up to 100% of the circuit shape width across a chip or wafer. This means that the correction shown in FIG. 1E could result in a feature without either necking or without a collar (D5=D6=D7=D8=0) as shown in FIG. 1A. If the collar width W2 shown in FIG. 1F is set to eliminate worst-case necking of circuit shapes, then there may be some cases where a circuit shape having a collar is created as illustrated in FIG. 1G. If W2 is set to eliminate necking on particular circuit shapes, then there may be a mixture of circuit shapes on the integrated circuit chip/wafer with varying degrees of necking, varying size collars, and no necking or collar.

Figure 2A:
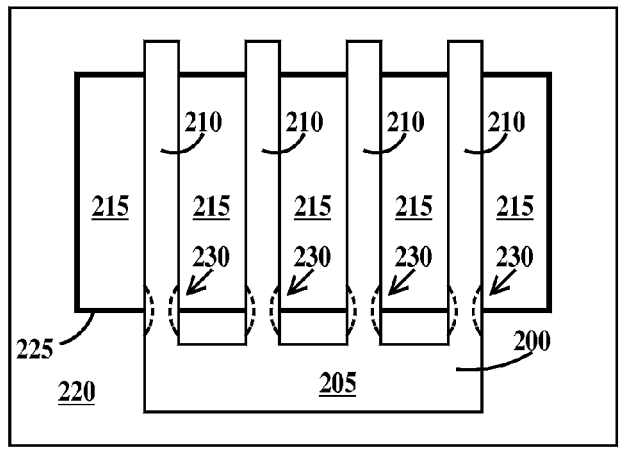
FIG. 2A is a top view illustrating an ideal and a defective multi-finger field effect transistor (FET) structure.
Figure 2B:
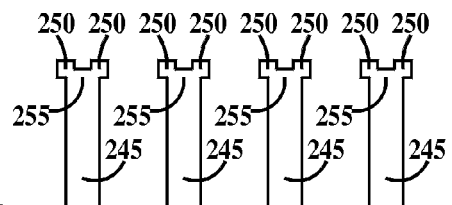
FIG. 2B is a top view of a gate electrode photomask shape corresponding to the FET of FIG. 2A after model-based OPC.
Figure 2C:
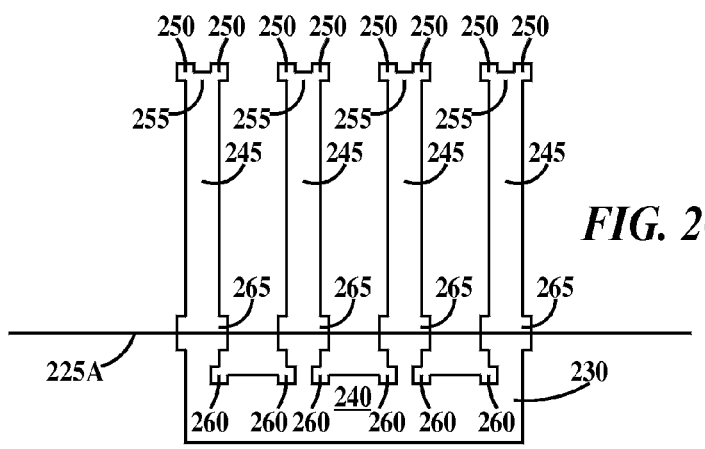
FIG. 2C is a top view of a gate electrode photomask shape corresponding to the FET of FIG. 2A after model-based OPC and rule-based OPC according to embodiments of the present invention.

FIG. 2A is a top view illustrating an ideal and a defective multi-finger field effect transistor (FET) structure. In FIG. 2A, a multi-finger gate electrode 200 includes a spine 205 and integral perpendicular fingers 210. Fingers 210 extend over a silicon region 215. Silicon region 215 is surrounded by shallow trench isolation (STI) 220. STI 220 comprises an insulator. Source/drains will be formed those in portions of silicon region 215 not covered by fingers 210. In one example STI 220 comprises silicon dioxide. Fingers 210 cross over an interface 225 between silicon region 215 and STI 220. In one example, a top surface of silicon region 215 and a top surface of STI 220 are coplanar but have different reflectivities to actinic radiation. In one example, the top surface of silicon region 215 and the top surface of STI 220 are parallel but not coplanar and may have the same or different reflectivities to actinic radiation. When the gate electrode mask shape illustrated in FIG. 2B is used to fabricate gate electrode 200, necked regions 230 (dashed lines) are formed in fingers 210 proximate to spine 205. In one example, using the gate electrode the mask shape of FIG. 2B, the width of fingers 210 over interface 225 is reduced to about 80% of nominal. Necking of fingers 210 causes increased leakage, increased stand by power due to Vt roll off and increased Idsat. When the gate electrode mask shape illustrated in FIG. 2C is used to fabricate gate electrode 200, there is no necking or the necking is greatly reduced. In one example, using the gate electrode the mask shape of FIG. 2C, the width of fingers 210 over interface 225 is between about 97.5 to about 100% of nominal. In one example, gate electrode necking results in about a 30% increased in standby current.

FIG. 2B is a top view of a gate electrode photomask shape corresponding to the FET of FIG. 2A after model-based OPC. In FIG. 2B model-based OPC has been used to generate a gate electrode mask shape 235 having a spine 240 and integral perpendicular fingers 245. The model-based OPC has added sub-lithographic shapes 250 (boxes overlapping the corners) to distal ends 255 of fingers 245. The model-based OPC has also added sub-lithographic shapes 260 (notches) at internal intersections of spine 240 and fingers 245. A sub-lithographic shape is a shape that is too small to print in the photolithographic system modeled in the OPC system. Reference line 225A indicate where gate electrode shape 235 would be perfectly aligned to interface 225 of FIG. 2A preparatory to printing an image of gate electrode circuit shape 205 in a photoresist layer on silicon region 215 and STI 220. As noted supra, gate electrode shape 235 does not correct necking. This is because model-based OPC models are (1) based on flat surfaces and (2) cannot look back to previous mask levels (which define the location of interface 225 (see FIG. 2A) relative to fingers 210.

FIG. 2C is a top view of a gate electrode photomask shape corresponding to the FET of FIG. 2A after model-based OPC and rule-based OPC according to embodiments of the present invention. FIG. 2C is similar to FIG. 2B except collars 265 have been added to fingers 245 over reference line 225A. In FIG. 2C, the model-based OPC described in reference to FIG. 2B has been performed followed by a rule-based OPC that adds collars 265. Collars 265 are spaced a distance away from spine 240 and do not touch spine 240.

Figure 3:
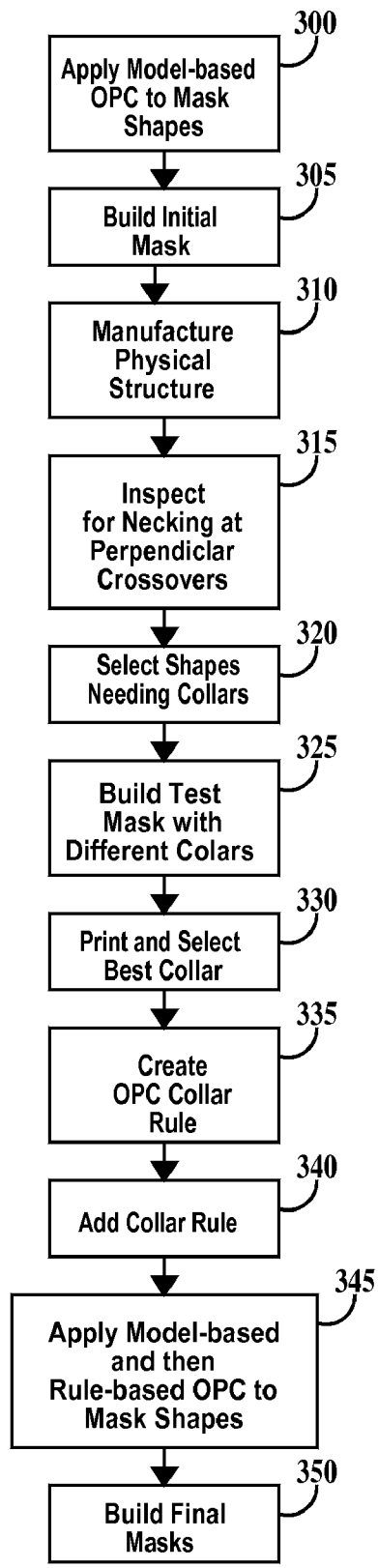
FIG. 3 is a flowchart of a first method for compensating for variations in structures of an integrated circuit.
Figure 4:
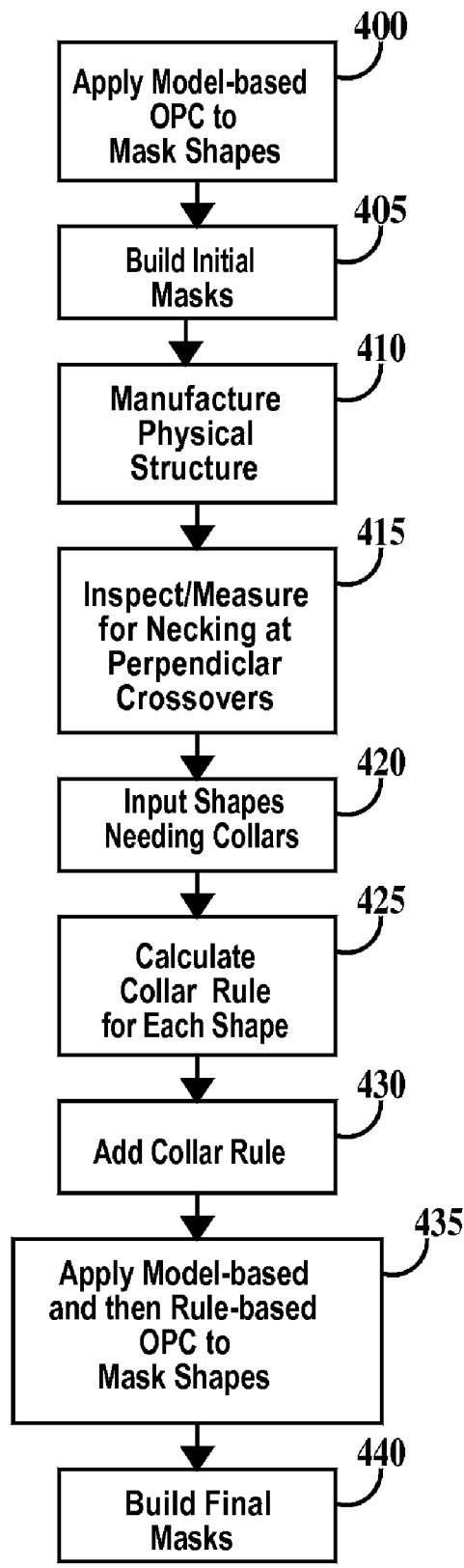
FIG. 4 is a flowchart of a second method for compensating for variations in structures of an integrated circuit.
Figure 5:
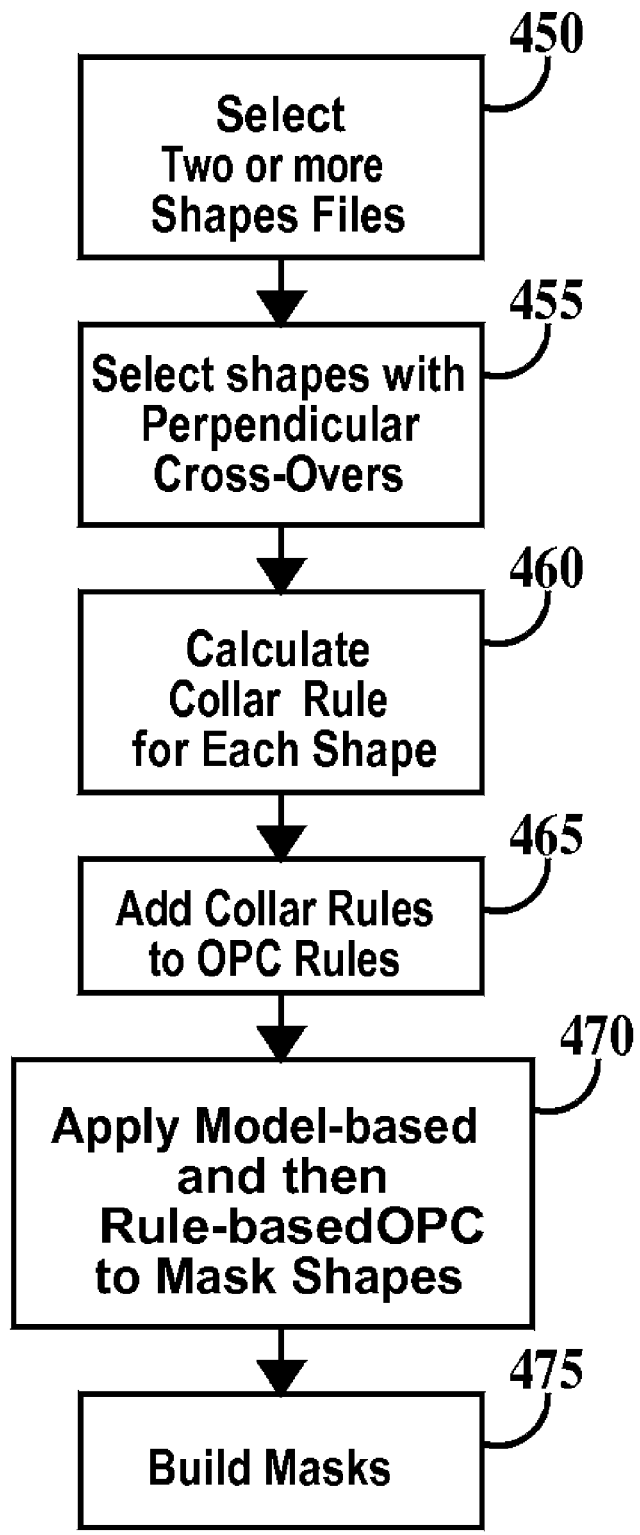
FIG. 5 is a flowchart of a third method for compensating for variations in structures of an integrated circuit.

The addition of rule-based OPC is illustrated in FIGS. 3, 4 and 5 and described infra. The differences between FIGS. 3, 4 and 5 is the degree of automation in generating a collar rule for the rule-based OPC.

FIG. 3 is a flowchart of a first method for compensating for variations in structures of an integrated circuit. In step 300, model-based OPC is performed on mask design shapes. In step 305, an initial mask having only model-based OPC corrected mask shapes is fabricated. In step 310, circuit shapes are fabricated on an initial integrated circuit using the photomasks from step 305. The initial integrated circuit has an interface between first and second regions (e.g., between silicon and insulator regions). In step 315, selected circuit shapes (e.g., multi-finger gate electrodes and other circuit shapes found to have necking problems when perpendicularly crossing a lower level boundary and which significantly effect the performance of the integrated circuit) are inspected/measured. This may be a manual inspection or an automated machine inspection/measurement. In step 320, circuit shapes needing collars are selected. In step 325, a test mask having sets of mask shapes corresponding to the selected mask shapes are fabricated, each mask shape of each set of mask shapes having different collar sizes. The test mask itself, may have had model-based OPC correction applied. In step 330, test circuit shapes are fabricated on a test integrated circuit (having a similar interface and similar first and second regions as the initial integrated circuit) using the test mask and the collar resulting in a width of the circuit shape over the interface closet to the nominal width of the circuit shape is selected. Note, some collars may still have some degree of necking and some collars may result in negative necking (i.e., bulging). In step 335, an OPC rule adding a particular sized collar to particular mask shapes in particular locations is created. The OPC rule is based on the analysis of step 330 and may be a simple selection of the collar giving a width closest to a nominal width (i.e., no necking) or an extrapolation between two collars giving widths on opposite sides of the nominal width. In step 345, model-based OPC is first applied to a mask design shapes, then a rule-based OPC containing the collar rule(s) is applied to mask design shapes. In step 350, a final mask having model-based OPC and rule-based OPC corrected mask shapes is fabricated. It is advantageous that the model-based OPC be performed first, as performing model-based OPC after rule-based OPC could adversely affect the final dimensions of the collars. The final mask is used to fabricate manufacturing integrated circuits.

FIG. 4 is a flowchart of a second method for compensating for variations in structures of an integrated circuit. In FIG. 4, steps 400, 405, 410, 415 and 420 are the same as respective steps 300, 305, 310, 315 and 320 of FIG. 3. In FIG. 425, a software module calculates a collar rule for each circuit shape needing a collar added to the mask shape. In one example, the software module calculates the collar rule based on a width of the shape. In one example, the software module calculates the collar rule based on the degree of necking. Steps 430, 435 and 440 are the same as respective steps 340, 345 and 350 of FIG. 3.

FIG. 5 is a flowchart of a third method for compensating for variations in structures of an integrated circuit. In step 450, two or more different shapes files of a same circuit designs are selected. In step 455, design shapes in the two or more mask level designs are compared looking for perpendicular crossovers of certain design shapes (e.g., multi-finger gate electrodes perpendicularly crossing a silicon-insulator interface defined by earlier mask levels and other circuit shapes found to have necking problems when perpendicularly crossing a lower level boundary and which significantly effect the performance of the integrated circuit) or in certain regions of a design grid. The design grid defines the location of design shapes, mask shapes and circuit shapes relative to reference points on the design grid (e.g., a corner of the grid having coordinates 0,0). Steps 460, 465, 470 and 475 are the same as respective steps 425, 430, 435 and 440 of FIG. 4.

It should be understood that an additional correction may be applied to mask shapes. This correction is called compensation. Compensation is applied to all mask design shapes in a shapes file and increases or decreases the width and lengths of all mask design shapes the same. Compensation should not be confused with OPC, which does not adjust all mask design shapes the same. Compensation may be applied immediately before or after steps 330 and 345 of FIG. 3, immediately before or after steps 400 and 435 of FIG. 4, and immediately before or after step 470 of FIG. 5. One purpose of compensation is to adjust for non-lithographic bias of the manufacturing process (e.g., etch bias, out-diffusion, etc).

Figure 6:
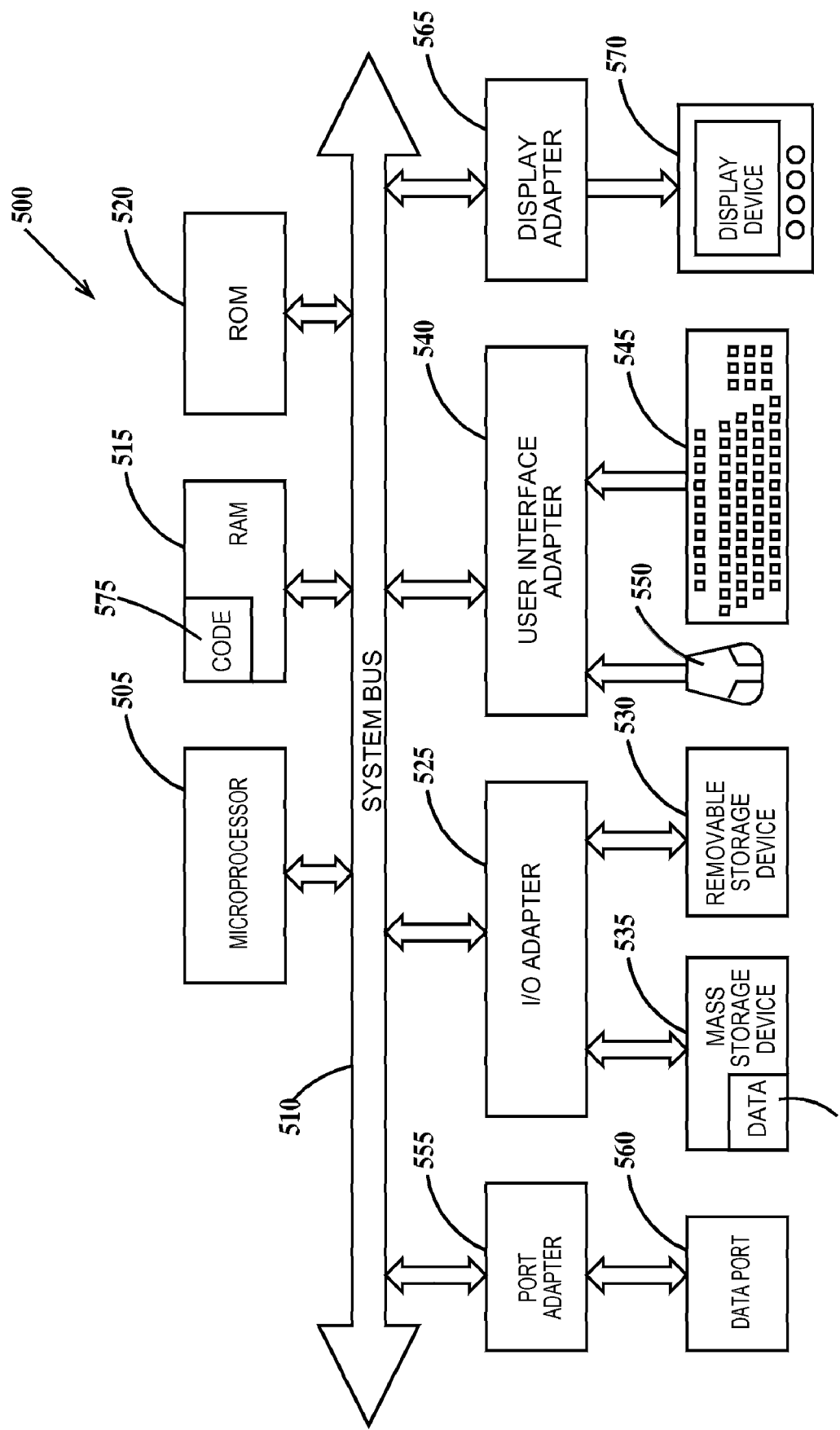
FIG. 6 is a schematic block diagram of a general-purpose computer for practicing the present invention.

FIG. 6 is a schematic block diagram of a general-purpose computer for practicing the present invention. Generally, the method described herein with respect to compensating for variations in structures of an integrated circuit is practiced with a general-purpose computer and the methods described supra in steps 300, 335, 340 and 345 of the flow diagrams of FIG. 3, steps 400, 425, 430, and 435 of FIG. 4 and steps 450, 455, 460, 465 and 470 of FIG. 5 may be coded as a set of instructions on removable or hard media for use by the general-purpose computer.

In FIG. 6, computer system 500 has at least one microprocessor or central processing unit (CPU) 505. CPU 505 is interconnected via a system bus 510 to a random access memory (RAM) 515, a read-only memory (ROM) 520, an input/output (I/O) adapter 525 for a connecting a removable data and/or program storage device 530 and a mass data and/or program storage device 535, a user interface adapter 540 for connecting a keyboard 545 and a mouse 550, a port adapter 555 for connecting a data port 560 and a display adapter 565 for connecting a display device 570.

ROM 520 contains the basic operating system for computer system 500. The operating system may alternatively reside in RAM 515 or elsewhere as is known in the art. Examples of removable data and/or program storage device 630 include magnetic media such as floppy drives and tape drives and optical media such as CD ROM drives. Examples of mass data and/or program storage device 535 include electronic, magnetic, optical, electromagnetic, infrared, and semiconductor devices. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 545 and mouse 550, other user input devices such as trackballs, writing tablets, pressure pads, microphones, light pens and position-sensing screen displays may be connected to user interface 540. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 530, fed through data port 560 or typed in using keyboard 545.

Thus the present invention discloses a process for supporting computer infrastructure, integrating, hosting, maintaining, and deploying computer-readable code into the computer system 500, wherein the code in combination with the computer system 500 is capable of performing a method for compensating for variations in structures of an integrated circuit.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   (a) selecting a mask design shape for a photomask from a shapes file and selecting a region of said mask design shape;
   (b) using a computer, applying a first optical proximity correction to all of said mask design shape based on a computer model of a photolithographic process that generates a simulated photoresist pattern based on said mask design shape;
   after (b), (c) using a computer, applying a second optical proximity correction to said selected region of said mask design shape based on an optical proximity correction geometric rule applied to mask design shape; and
   wherein said mask design shape defines a circuit shape and said selected region of said mask design shape defines a region of said circuit shape that crosses an interface between a first region and a second region of an integrated circuit.

2. The method of claim 1, wherein said circuit shape crosses said interface perpendicularly.

3. The method of claim 1, wherein said first and second regions have different reflectivities.

4. The method of claim 1, wherein a top surface of said first region is raised above a top surface of said second region forming a step.

5. The method of claim 1, wherein (c) includes:
   placing a design collar on said mask design shape in said selected region, said design collar increasing a width of said mask design shape proximate to said interface in a direction parallel to a reference line corresponding in location and direction to said interface, said design collar extending proximate to said reference line perpendicularly on either side of said reference line.

6. The method of claim 5, further including before (a):
   defining a set of test mask design shapes based on said mask design shape;
   placing different size test collars on different test mask design shapes of said set of test mask design shapes;
   fabricating a test photomask containing a set of test mask shapes from said set of test mask design shapes;
   fabricating a test integrated circuit having a test interface between first and second test regions, said test interface between said first and second test regions corresponding to said interface between said first and second regions;
   fabricating a set of test circuit shapes corresponding to said set of mask shapes from said test mask; and
   selecting collar dimensions for said design collar based on measurements of said test circuit shapes in locations over said test interface.

7. The method of claim 6, further including:
   before placing said different sized test collars, performing a model-based optical proximity correction on each mask design shape of said set of mask design shapes.

8. The method of claim 5, wherein dimensions of said design collar are based on a width of said mask design shape measured parallel to said reference line and away from said reference line.

9. The method of claim 5, further including:
   after (c), (d) fabricating a manufacturing photomask having a mask shape having a mask collar corresponding to said mask design shape having said design collar; and
   after (d), (e) fabricating said circuit shape using said manufacturing photomask having said mask shape having said mask collar, wherein said mask collar on said mask shape compensates for reflectivity differences between said first and second regions.

10. The method of claim 5, further including:
    after (c), (d) fabricating a manufacturing photomask having a mask shape having a mask collar corresponding to said mask design shape including said design collar; and
    after (d), (e) fabricating said circuit shape using said manufacturing photomask having said mask shape having said mask collar, wherein said mask collar on said mask shape prevents necking of said circuit shape over said interface.

11. A method, comprising:
    (a) selecting a mask design shape for a photomask from a shapes file and selecting a region of said mask design shape, said mask design shape comprising a spine and two or more fingers extending perpendicularly from said spine, said selected regions consisting of regions of each of said fingers that are proximate to said spine;
    (b) using a computer, applying a first optical proximity correction to said selected region of said mask design shape based on an optical proximity correction geometric rule applied to mask design shape;
    after (b), (c) using a computer, applying a second optical proximity correction to all of said mask design shape using a computer model of a photolithographic process that generates a simulated photoresist pattern based on said mask design shape; and
    wherein said mask design shape defines a multi-finger gate electrode circuit shape and said selected regions of said mask design shape define regions of said fingers that cross an interface between a silicon region and an insulator region of an integrated circuit.

12. The method of claim 11, wherein said fingers cross said interface perpendicularly.

13. The method of claim 11, wherein said silicon region and said insulator regions have different reflectivities.

14. The method of claim 11, wherein a top surface of said silicon region and a top surface of said insulator region are parallel but not coplanar.

15. The method of claim 11, wherein (c) includes:

placing design collars on fingers of said mask design shape in said selected regions, said design collars increasing widths of said fingers of said mask design shape proximate to said interface in a direction parallel to a reference line corresponding in location and direction to said interface, said design collars extending proximate to said reference line perpendicularly on either side of said reference line, said collars spaced away from said spine.

16. The method of claim 15, further including before (a):

defining a set of test mask design shapes based on said mask design shape;

placing different size test collars on different test mask design shapes of said set of test mask design shapes;

fabricating a test photomask containing a set of test mask shapes from said set of test mask design shapes;

fabricating a test integrated circuit having a test interface between test silicon and test insulator regions, said test interface between said test silicon and test insulator regions corresponding to said interface between said silicon and insulator regions;

fabricating a set of test circuit shapes corresponding to said set of mask shapes from said test mask; and selecting collar dimensions for said design collars based on measurements of said test circuit shapes in locations over said test interface.

17. The method of claim 16, further including:

before placing said different sized test collars, performing a model-based optical proximity correction on each mask design shape of said set of mask design shapes.

18. The method of claim 15, wherein dimensions of said design collars are based on a width of said fingers of said mask design shape measured parallel to said reference line and away from said reference line.

19. The method of claim 15, further including:

after (c), (d) fabricating a manufacturing photomask having a mask shape including mask collars corresponding to said mask design shape having said design collars; and after (d), (e) fabricating said circuit shape using said manufacturing photomask, wherein said mask collars on said fingers of said mask shape compensate for reflectivity differences between said silicon and insulator regions.

20. The method of claim 15, further including:

after (c), (d) fabricating a manufacturing photomask having a mask shape including mask collars corresponding to said mask design shape including said design collars; and after (d), (e) fabricating said circuit shape using said manufacturing photomask, wherein said mask collars on said mask shape prevent necking of said fingers of said circuit shape over said interface.

* * * * *